(12) United States Patent
Yoon et al.

(10) Patent No.: US 6,359,459 B1
(45) Date of Patent: Mar. 19, 2002

(54) INTEGRATED CIRCUITS INCLUDING VOLTAGE-CONTROLLABLE POWER SUPPLY SYSTEMS THAT CAN BE USED FOR LOW SUPPLY VOLTAGE MARGIN TESTING AND RELATED METHODS

(75) Inventors: Sei-seung Yoon; Sang-pyo Hong, both of Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/399,994

(22) Filed: Sep. 20, 1999

(Under 37 CFR 1.47)

(30) Foreign Application Priority Data

Sep. 25, 1998 (KR) .......................................... 98-39957

(51) Int. Cl.$^7$ ............................................... G01R 31/28
(52) U.S. Cl. ................................... 324/765; 324/158.1
(58) Field of Search .............................. 324/771, 416, 324/522, 765, 763, 158.1; 327/333; 326/16

(56) References Cited

U.S. PATENT DOCUMENTS

| 4,502,140 A | * | 2/1985 | Proebsting | 714/718 |
| 4,910,666 A | * | 3/1990 | Nibby et al. | 714/21 |
| 5,046,052 A | | 9/1991 | Miyaji et al. | 365/226 |
| 5,055,766 A | * | 10/1991 | McDermott et al. | 323/255 |
| 5,194,762 A | * | 3/1993 | Hara et al. | 327/533 |
| 5,216,678 A | * | 6/1993 | Nawaki | 714/745 |
| 5,568,435 A | * | 10/1996 | Marr | 365/201 |
| 5,627,493 A | * | 5/1997 | Takeuchi et al. | 327/546 |
| 5,877,993 A | * | 3/1999 | Biegel et al. | 365/201 |
| 6,121,786 A | * | 9/2000 | Yamagami et al. | 324/765 |

FOREIGN PATENT DOCUMENTS

| JP | 5924318 | * | 7/1982 | 323/234 |
| JP | 2-40195 | | 2/1990 | |

OTHER PUBLICATIONS

Horiguchi et al., "1990 Symposium on VLSI Circuits, Digest of Technical Papers," 1990, pp. 75–76.
Horiguchi et al., "1990 Symposium on VLSI Circuits, Digest of Technical Papers," 1990 VLSI Circuits Symposium, Honolulu, Hawaii, Jun. 7–9, 1990, pp. 75–76.

* cited by examiner

Primary Examiner—Safet Metjahic
Assistant Examiner—Vincent Q. Nguyen
(74) Attorney, Agent, or Firm—Myers Bigel Sibley & Sajovec

(57) ABSTRACT

Integrated circuits and methods use a margin test voltage generator that is powered at a first power supply voltage to generate a second power supply voltage that has a magnitude that is less than the magnitude of the first power supply voltage. During a low supply voltage margin test, a first logic circuit is powered at the first power supply voltage while a second logic circuit, which is the subject of the test, is powered at the second power supply voltage. As a result, the first power supply voltage may remain at a sufficient magnitude to reliably power other devices or components that are not undergoing the low supply voltage margin test.

16 Claims, 5 Drawing Sheets

INTEGRATED CIRCUITS INCLUDING VOLTAGE-CONTROLLABLE POWER SUPPLY SYSTEMS THAT CAN BE USED FOR LOW SUPPLY VOLTAGE MARGIN TESTING AND RELATED METHODS

CROSS REFERENCE TO RELATED APPLICATION

This application claims the benefit of Korean Patent Application No. 98 -39957, filed Sep. 25, 1998, the disclosure of which is hereby incorporated herein by reference.

FIELD OF THE INVENTION

The present invention relates generally to the field of power supplies, and, more particularly, to power supply systems and methods for performing low supply voltage margin tests.

BACKGROUND OF THE INVENTION

As the functionality of integrated circuit devices continues to increase and diversify, the number and type of test conditions and scenarios may also increase. For example, two such tests that may be used to verify the operability of integrated circuit devices are the high supply voltage margin test and the low supply voltage margin test. An integrated circuit device may be given a rating that identifies the maximum and minimum voltages that can be used to power the device while still maintaining normal operation. In a high supply voltage margin test, the maximum power supply voltage is applied to verify that the integrated circuit device can still operate normally. Likewise, in a low supply voltage margin test, the minimum power supply voltage is applied to verify that the integrated circuit device can still operate normally. The low supply voltage margin test is discussed hereafter in more detail.

In general, an integrated circuit device receives an external supply voltage and generates an internal supply voltage therefrom such that the internal supply voltage has a lower magnitude than the external supply voltage. FIG. 1 illustrates a low supply voltage margin test for a conventional integrated circuit device in which the internal supply voltage VINT has a clamp level of 3.0V. A low supply voltage margin test is generally performed at a voltage level having a lower magnitude than the magnitude of the internal supply voltage. Thus, to perform a low supply voltage margin test, the external supply voltage VEXT is lowered until it falls below the clamp level of 3.0V. The external supply voltage VEXT and internal supply voltage VINT track one another below the clamp level of 3.0V as shown in the FIG. 1 graph. In the FIG. 1 example, the low supply voltage margin test is performed at a voltage V1 of 2.8V.

The external supply voltage VEXT may also be used to generate additional internal supply voltages to power other components in the integrated circuit device or to power other components directly. For example, a semiconductor memory device may use the external supply voltage VEXT to generate a first internal supply voltage for a memory cell array and a second internal supply voltage for peripheral circuitry. Accordingly, when the external supply voltage VEXT is lowered to perform the low supply voltage margin test for the memory cell array, the second internal supply voltage for the peripheral circuitry may also be affected.

Returning to the FIG. 1 example, the internal supply voltage VINT has a clamp level of 3.0V and the low supply voltage margin test is performed at a relatively high voltage level of 2.8V. In this example, the external supply voltage VEXT may be of sufficient magnitude (i.e., 2.8V) to be used for generating other internal supply voltages or directly powering other components.

With reference to FIG. 2, a low supply voltage margin test is illustrated for a conventional integrated circuit device in which the internal supply voltage VINT has a clamp level of 2.5V. Similar to the FIG. 1 example, to perform a low supply voltage margin test, the external supply voltage VEXT is lowered until it falls below the clamp level of 2.5V. The external supply voltage VEXT and internal supply voltage VINT track one another below the clamp level of 2.5V as shown in the FIG. 2 graph. In the FIG. 2 example, the low supply voltage margin test is performed at a voltage V2 of 2.3V. This reduced level of 2.3V, however, may not be sufficient to reliably power other devices or components not undergoing the low supply voltage margin test.

Consequently, there exists a need for improved power supply systems and methods that can be used for low supply voltage margin testing while reducing the effect of the testing on other components, systems, or devices that are not test subjects.

SUMMARY OF THE INVENTION

It is therefore an object of the present invention to provide improved power supply systems and methods that can be used for low supply voltage margin testing.

It is another object of the present invention to provide improved power supply systems and methods that can reduce the effect of low supply voltage margin testing on other components, systems, or devices that are not test subjects.

These and other objects, advantages, and features of the present invention may be provided by integrated circuits and methods that use a margin test voltage generator that is powered at a first power supply voltage to generate a second power supply voltage that has a magnitude that is less than the magnitude of the first power supply voltage. During a low supply voltage margin test, a first logic circuit is powered at the first power supply voltage while a second logic circuit, which is the subject of the test, is powered at the second power supply voltage. As a result, the first power supply voltage may remain at a sufficient magnitude to reliably power other devices or components that are not undergoing the low supply voltage margin test.

In accordance with an aspect of the invention, the margin test voltage generator comprises a reference voltage generation unit, which is responsive to a control signal having a plurality of states, to generate a first reference voltage that has a magnitude corresponding to the state of the control signal. The control signal can be used to generate the second power supply voltage at a magnitude that can be used to perform a low supply voltage margin test without the need to reduce the first power supply voltage to the same test magnitude.

In accordance with another aspect of the invention, a scaling unit, which is responsive to the first reference voltage, generates a second reference voltage. The scaling unit may be used to improve the accuracy of the magnitude of the first reference voltage by allowing the reference voltage generation unit to generate the first reference voltage at a relatively low magnitude. The scaling unit can then be used to generate a second reference voltage, which is a scaled or amplified representation of the first reference voltage. In a preferred embodiment, the scaling unit comprises a controller circuit and a differential amplifier circuit.

In accordance with still another aspect of the invention, a supply voltage generation unit, which is responsive to the second reference voltage, generates the second power supply voltage such that the second power supply voltage and the second reference voltage have approximately the same magnitude. In a preferred embodiment, the supply voltage generation unit comprises a comparator circuit and a driver circuit.

Power supply systems and methods according to the present invention can therefore be used to perform a low supply voltage margin test while maintaining a potential difference between, for example, an external supply voltage and an internal supply voltage. Advantageously, the impact on other systems, components, or devices that may directly or indirectly rely upon the external supply voltage can be reduced.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
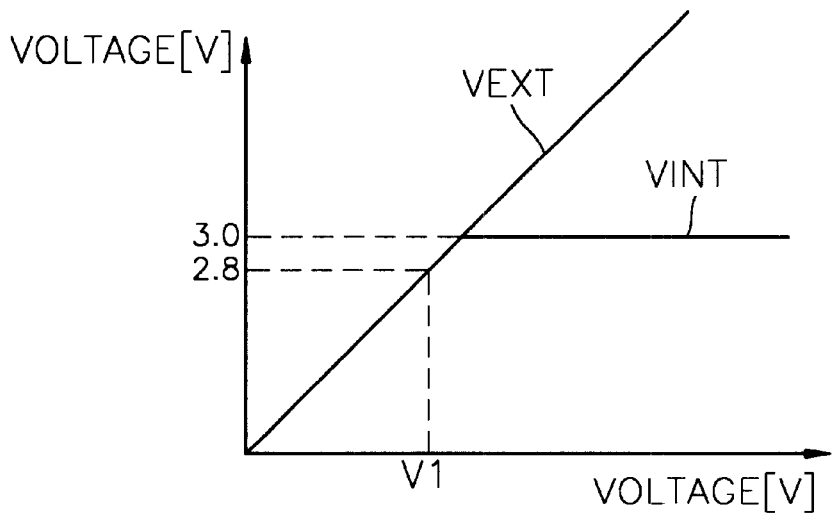
FIGS. 1 and 2 are graphs that illustrate voltages used in a conventional low supply voltage margin test.
Figure 2:
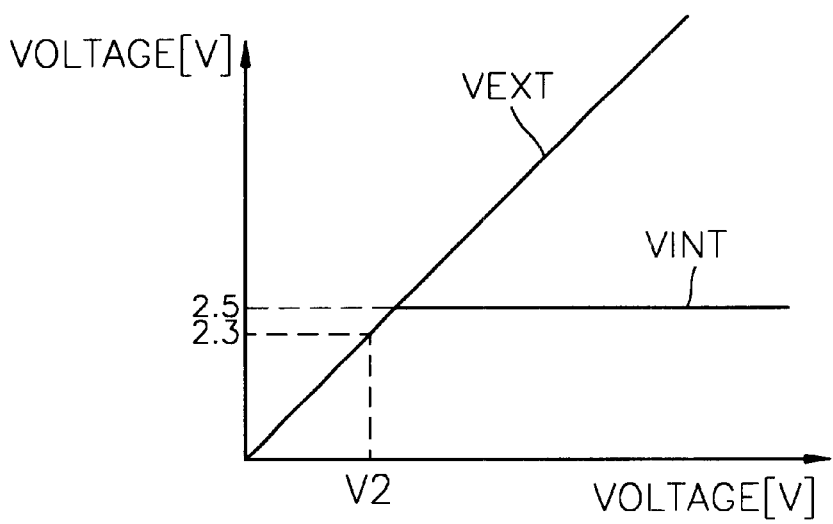

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

For purposes of illustration and in no way limited thereto, power supply systems and methods in accordance with the present invention will be discussed hereafter as embodied in integrated circuit devices and used to perform low supply voltage margin tests. It should be understood, however, that the power supply systems and methods of the present invention can be used in other electrically powered systems and devices.

Figure 3:
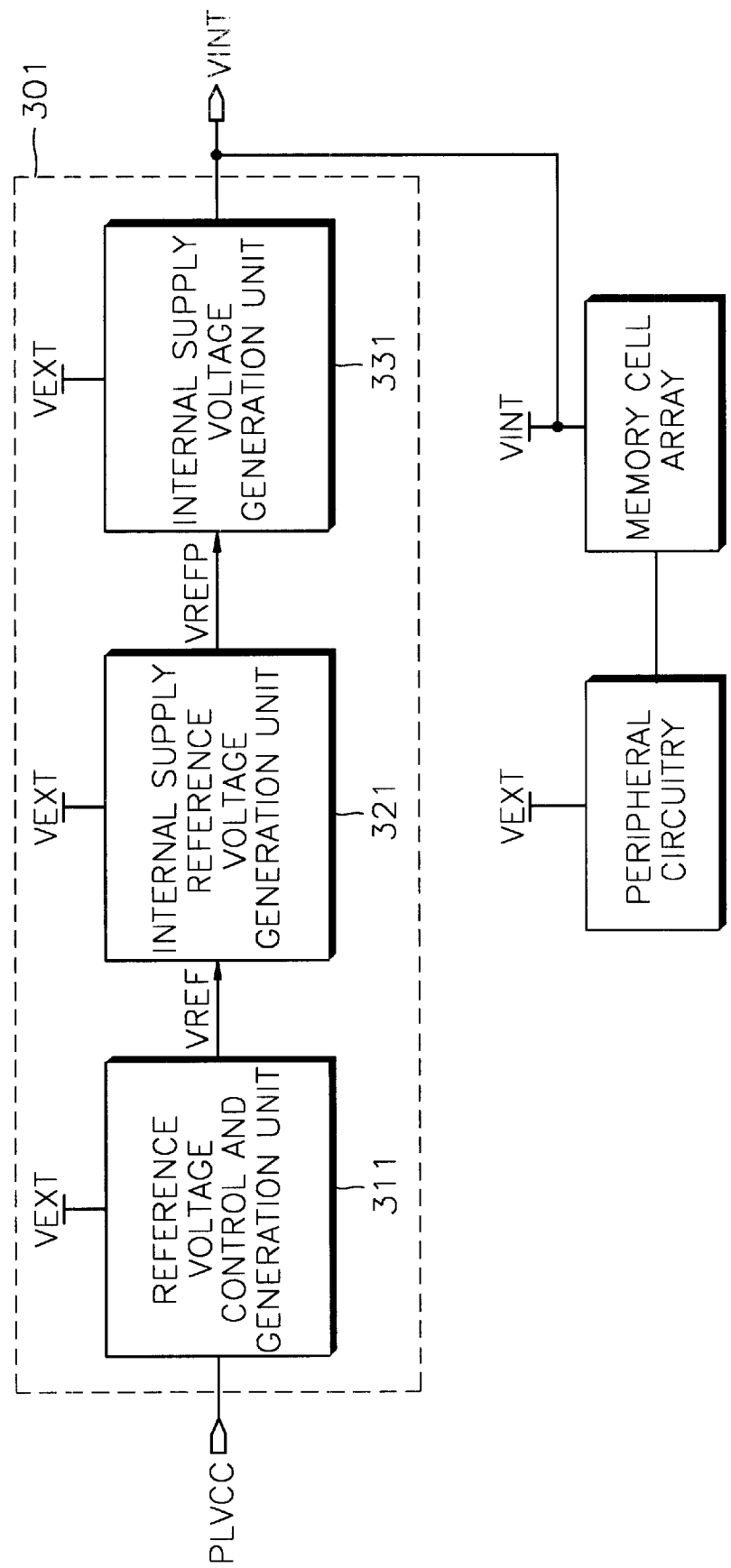
FIG. 3 is a high-level block diagram that illustrates power supply systems and methods in accordance with the present invention.

With reference to FIG. 3, a power supply system 301 according to a preferred embodiment of the present invention comprises a reference voltage control and generation unit 311, an internal supply reference voltage generation unit or scaling unit 321, and an internal supply voltage generation unit 331. Broadly stated, the power supply system 301 is responsive to an external supply or reference voltage VEXT and a control signal PLVCC and generates an internal supply or reference voltage VINT. Operations of the power supply system 301 are described hereafter in greater detail.

The reference voltage control and generation unit 311 is responsive to the external supply voltage VEXT and the control signal PLVCC and generates a reference voltage VREF. The control signal PLVCC has a plurality of states, which are used to control the magnitude of the reference voltage VREF. For example, when the control signal PLVCC is driven to a "high" logic state (e.g., a "high" voltage level or magnitude), the reference voltage control and generation unit 311 drives the reference voltage VREF to a predetermined level or magnitude corresponding to the normal operating voltage for the integrated circuit device. Moreover, the reference voltage control and generation unit 311 preferably serves as a clamping circuit such that the reference voltage VREF is maintained at the normal operating magnitude as long as the external supply voltage VEXT has a magnitude equal to or greater than a predetermined magnitude or level.

Conversely, when the control signal PLVCC is driven to a "low" logic state (e.g., a "low" voltage level or magnitude), the reference voltage control and generation unit 311 drives the reference voltage VREF to a level or magnitude that is less than the predetermined level or magnitude corresponding to the normal operating voltage. For example, if the reference voltage VREF is 2.5V when the control signal PLVCC is driven to a "high" logic state, then the reference voltage VREF may be lowered to 2.3V when the control signal PLVCC is driven to a "low" logic state.

Thus, the reference voltage control and generation unit 311 can facilitate a low supply voltage margin test through use of the control signal PLVCC. Advantageously, a potential difference can be maintained between the external reference voltage VEXT and the reference voltage VREF during the performance of the low supply voltage margin test. In contrast with conventional low supply voltage margin test systems in which the external supply voltage is lowered to the magnitude of the internal supply voltage clamp level and then reduced further to perform the low supply voltage margin test, the external reference voltage VEXT can be maintained at or above the normal operating magnitude of the reference voltage VREF during a low supply voltage margin test in accordance with the present invention.

The power supply system 301 preferably includes an internal supply reference voltage generation unit or scaling unit 321 that is responsive to the external supply voltage VEXT and the reference voltage VREF and generates a reference voltage VREFP having a magnitude that is typically twice the magnitude of the reference voltage VREF. The magnitude of the reference voltage VREFP can be controlled by the architecture of the internal supply reference voltage generation unit 321. When the reference voltage VREF generated by the reference voltage control and generation unit 311 is set to a higher magnitude (e.g., approximately 2V to 4V), the accuracy of the reference voltage VREF may deteriorate. The reference voltage VREF, therefore, is preferably generated at a magnitude of approximately 1V for improved accuracy and then scaled by the internal supply reference voltage generation unit 321 to generate the reference voltage VREFP, which is provided to the internal supply voltage generation unit 331.

Thus, the internal supply reference voltage generation unit 321 can improve the accuracy of the magnitude of the reference voltage VREFP used by the internal supply voltage generation unit 331. If the internal power supply system 301 does not require a high degree of accuracy, then the internal supply reference voltage generation unit 321 can be eliminated and the reference voltage control and generation unit 311 can be used to generate the reference voltage VREF at a higher magnitude (e.g., 2.5V), which is provided directly to the internal supply voltage generation unit 331.

The internal supply voltage generation unit 331 is responsive to the external supply voltage VEXT and the reference voltage VREFP and generates an internal supply voltage VINT. The internal supply voltage VINT is generated at approximately the same magnitude as the reference voltage VREFP. Moreover, the internal supply voltage generation unit 331 preferably serves as a clamping circuit such that the internal supply voltage VINT is maintained at a constant magnitude as long as the external supply voltage VEXT has a magnitude equal to or greater than a predetermined magnitude or level.

Figure 4:
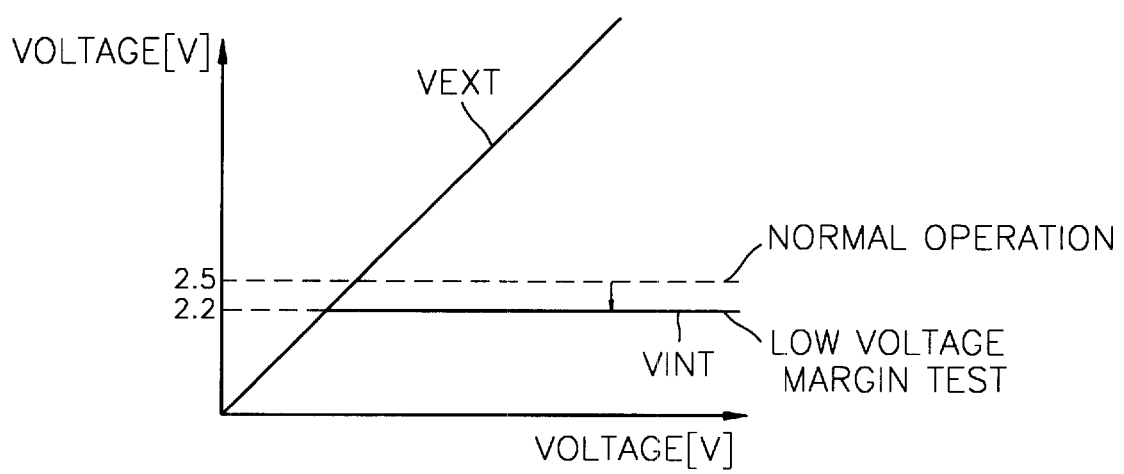
FIG. 4 is a graph that illustrates voltages used in a low supply voltage margin test for an integrated circuit device incorporating a power supply system of FIG. 3.

FIG. 4 illustrates a low supply voltage margin test for an integrated circuit device using the power supply system 301 of the present invention. With reference to FIG. 4, when the external supply voltage VEXT has been applied to the power supply system 301, the internal supply voltage VINT can be adjusted to two voltage levels or magnitudes in accordance with the voltage level or magnitude of the control signal PLVCC. The two magnitudes or levels of the internal supply voltage VINT include a first magnitude corresponding to a normal operation voltage and a second magnitude corresponding to a voltage used for a low supply voltage margin test.

During normal operation of the integrated circuit device, the control signal PLVCC is driven to a "high" logic state. To perform a low supply voltage margin test, however, the control signal PLVCC is driven to a "low" logic state, which reduces the magnitude of the internal supply voltage VINT from its normal operation magnitude. For example, an integrated circuit memory device may use an external supply voltage VEXT of 2.8V and an internal supply voltage VINT of 2.5V during normal operation (i.e., the internal supply voltage VINT clamp level or magnitude is 2.5V). The control signal PLVCC can be driven to a "low" logic state, which reduces the magnitude of the internal supply voltage VINT to 2.2V to perform a low supply voltage margin test. As shown in the graph of FIG. 4, a low supply voltage margin test can be performed at 2.2V when the external supply voltage VEXT has a magnitude of 2.2V or higher. Advantageously, the magnitude of the internal supply voltage VINT can be reduced to a desired test magnitude (e.g., 2.2V) without the need to reduce the external supply voltage VEXT to the same magnitude. A potential difference can therefore be maintained between the external supply voltage VEXT and the internal supply voltage VINT during the low supply voltage margin test. As a result, the external supply voltage VEXT may remain at a sufficient magnitude to generate other internal supply voltages or to directly power other components of the integrated circuit memory device. For example, it may be desirable to perform a low supply voltage margin test on the memory cell array of an integrated circuit memory device while still using the external supply voltage VEXT to generate another internal supply voltage for powering the peripheral circuitry associated with the memory cell array.

Figure 5:
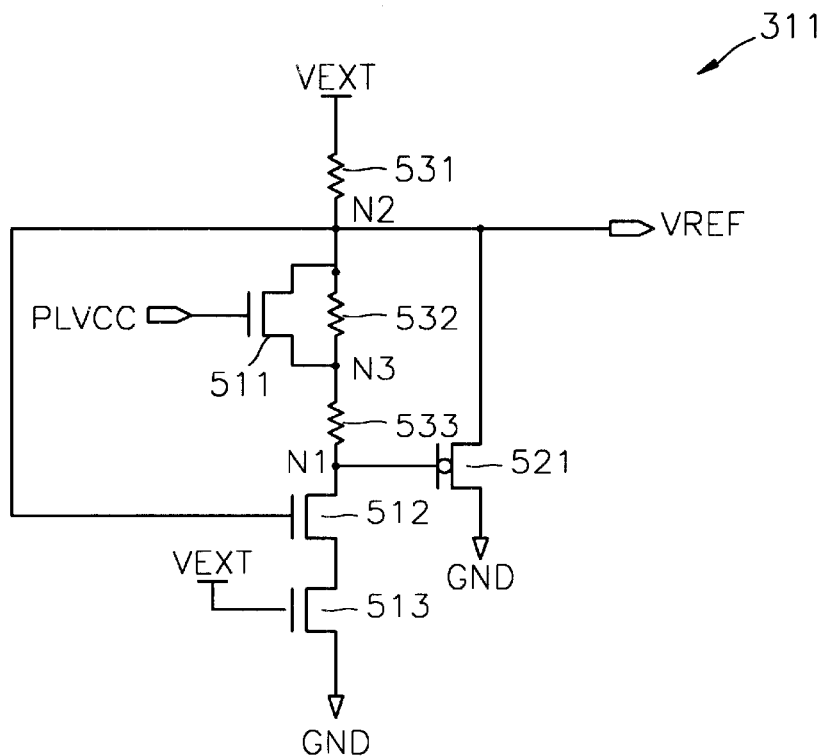
FIG. 5 is an electrical schematic that illustrates a reference voltage generation unit of FIG. 3.

FIG. 5 is a circuit schematic of the reference voltage control and generation unit 311 of FIG. 3. With reference to FIG. 5, the reference voltage control and generation unit 311, according to a preferred embodiment of the present invention, comprises NMOS transistors 511, 512, and 513, resistors 531, 532, and 533, and a PMOS transistor 521 configured as shown. The external supply voltage VEXT is applied to the gate of the NMOS transistor 513, which turns the NMOS transistor 513 on.

The resistors 531 through 533 are connected to each other in series and the NMOS transistors 512 and 513 are connected to each other in series, which can allow for distribution of the external supply voltage VEXT. The NMOS transistor 511 is connected in parallel with the resistor 532. The gate of the PMOS transistor 521 is connected to the drain (i.e., node N1) of the NMOS transistor 512. Thus, when the voltage generated at the node N1 is lower than a threshold voltage of the PMOS transistor 521, the PMOS transistor 521 is turned on. Conversely, when the voltage generated at the node N1 is higher than the threshold voltage of the PMOS transistor 521, the PMOS transistor 521 is turned off.

While the voltage generated at the node N1 is lower than the threshold voltage of the PMOS transistor 521, a current flowing in the PMOS transistor 521 varies according to the magnitude of the voltage at the node N1. Thus, as the voltage at the node N1 approaches the threshold voltage of the PMOS transistor 521, a current flowing through the PMOS transistor 521 is reduced. Conversely, as the voltage at the node N1 moves lower than the threshold voltage of the PMOS transistor 521, the current flowing through the PMOS transistor 521 increases. As the current flow through the PMOS transistor 521 increases, the magnitude of the reference voltage VREF is decreases. Conversely, as the current flow through the PMOS transistor 521 decreases, the magnitude of the reference voltage VREF increases.

The voltage at the node N1 is determined by the values of the resistors 531, 532, and 533. That is, when the values of the resistors 531 through 533 are large, the resistors account for a larger voltage drop and the magnitude of the voltage at the node N1 is reduced. But when the values of the resistors 531 through 533 are small, the resistors account for a smaller voltage drop and the magnitude of the voltage at the node N1 is increased. The total resistance provided by the resistors 531 through 533 between the external reference voltage VEXT and the node N1 is controlled by the NMOS transistor 511. More specifically, when the NMOS transistor 511 is turned on, the resistor 532 is effectively removed from the circuit because the nodes N2 and N3 are short-circuited. Accordingly, the total resistance provided by the resistors 531 through 533 is reduced. On the other hand, when the NMOS transistor 511 is turned off, the total resistance provided by the resistors 531 through 533 increases because the NMOS transistor 511 no longer acts as a short circuit to remove the effect of the resistor 532. The NMOS transistor 511 is responsive to the control signal PLVCC, which is applied to the gate terminal as shown. That is, when the control signal PLVCC is driven to a "high" logic state (i.e., a "high" voltage level or magnitude), the NMOS transistor 511 is turned on, and when the control signal PLVCC is driven to a "low" logic state (i.e., a "low" voltage level or magnitude), the NMOS transistor 511 is turned off.

As described above, the magnitude of the voltage generated at the node N1 varies with the voltage level or magnitude of the control signal PLVCC. In addition, the magnitude of the reference voltage VREF varies with the magnitude of the voltage at the node N1. Therefore, the magnitude of the reference voltage VREF can be adjusted by controlling the voltage level or magnitude of the control signal PLVCC.

If the reference voltage VREF exceeds a predetermined magnitude or level, whether in normal operation or during a low supply voltage margin test, a voltage applied to the gate of the NMOS transistor 512 at node N1 increases in magnitude causing an increase in the amount of current flowing through the NMOS transistor 512. As a result, the voltage at the node N1 is reduced and more current flows through the PMOS transistor 521 causing a reduction in the reference voltage VREF. When the reference voltage VREF falls below a predetermined magnitude or level, whether in normal operation or during a low supply voltage margin test, the amount of current flowing through the NMOS transistor 512 is reduced. As a result, the voltage at the node N1 increases causing less current to flow through the PMOS transistor 521, which increases the reference voltage VREF. Repetition of these processes keeps the reference voltage VREF at a constant magnitude during steady state operation.

Figure 6:
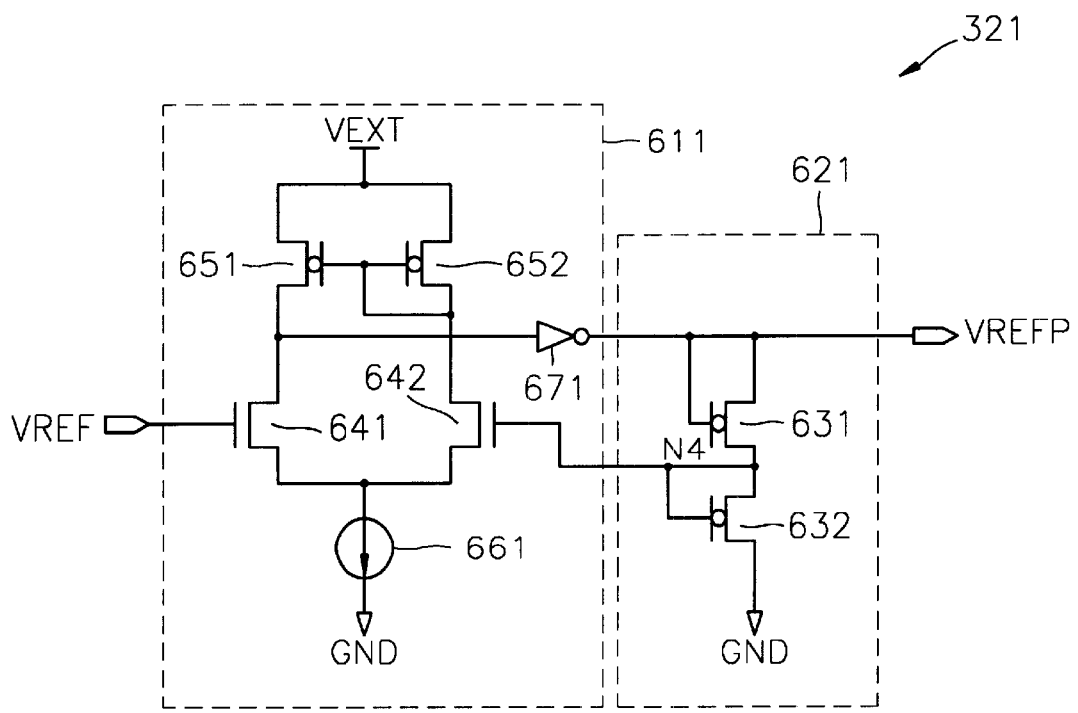
FIG. 6 is an electrical schematic that illustrates an internal supply reference voltage generation unit or scaling unit of FIG. 3.

FIG. 6 is a circuit schematic of the internal supply reference voltage generation unit or scaling unit 321 of FIG. 3. With reference to FIG. 6, the internal supply reference voltage generation unit 321, according to a preferred embodiment of the present invention, comprises a differential amplifier 611 and a controller 621. The differential amplifier 611 includes PMOS transistors 651 and 652, NMOS transistors 641 and 642, a current source 661, and an inverter 671 configured as shown. The differential amplifier 611 compares and amplifies the reference voltage VREF with a voltage fed back by the controller 621, i.e., a voltage generated at the node N4, and outputs a reference voltage VREFP that is approximately twice as high as the reference voltage VREF. The magnitude of the reference voltage VREFP changes in proportion to changes in the magnitude of the reference voltage VREF. That is, the magnitude of the reference voltage VREFP decreases as the magnitude of the reference voltage VREF decreases and the magnitude of the reference voltage VREFP increases as the magnitude of the reference voltage VREF increases. Accordingly, the scaled relationship between the reference voltage VREFP and the reference voltage VREF is maintained. A conventional differential amplifier is used to implement the differential amplifier 611 in a preferred embodiment.

The controller 621 is used to maintain the reference voltage VREFP at a constant magnitude. The controller 621 includes cascaded PMOS transistors 631 and 632, which preferably have the same driving capacity. Therefore, the magnitude of the voltage generated at the node N4 is one-half the magnitude of the reference voltage VREFP. Note that by altering the architecture of the controller 621, the relationship between the magnitudes of the reference voltages VREFP and VREF can be changed. For example, if three PMOS transistors having the same driving capacity are cascaded, then the magnitude of the reference voltage VREFP becomes three times as high as the magnitude of the reference voltage VREF. The magnitude of the voltage generated at the node N4 increases or decreases in direct proportion to an increase or decrease in the magnitude of the reference voltage VREFP. That is, when the magnitude of the reference voltage VREFP increases, the magnitude of the voltage at the node N4 increases as well. A voltage applied to the input port of the inverter 671 increases in magnitude with an increase in the magnitude of the voltage at the node N4, which reduces the magnitude of the reference voltage VREFP. Conversely, the magnitude of the voltage at the node N4 decreases in accordance with a decrease in the magnitude of the reference voltage VREFP. The magnitude of the voltage applied to the input port of the inverter 671 decreases in accordance with a decrease in the magnitude of the voltage at the node N4, which increases the reference voltage VREFP. As described above, the controller 621 maintains the reference voltage VREFP at a constant magnitude during steady state operation.

Figure 7:
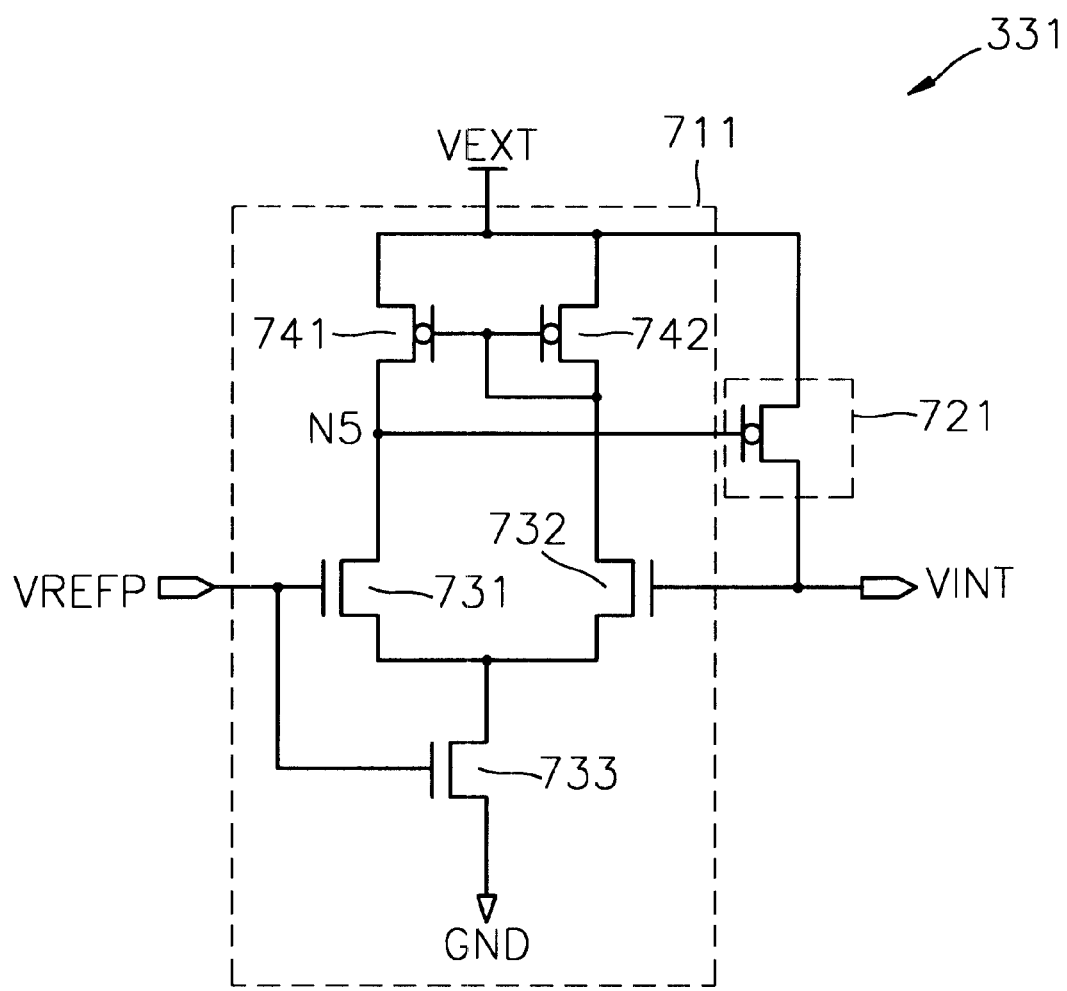
FIG. 7 is an electrical schematic that illustrates a supply voltage generation unit of FIG. 3.

FIG. 7 is a circuit schematic of the internal supply voltage generation unit 331 of FIG. 3. With reference to FIG. 7, the internal supply voltage generation unit 331, according to a preferred embodiment of the present invention, comprises a comparator 711 and a driver 721. The comparator 711 is a differential amplifier including NMOS transistors 731, 732, and 733 and PMOS transistors 741 and 742. The driver 721 is a PMOS transistor. The internal supply voltage generation unit 331 uses the external supply voltage VEXT as an operating voltage.

Operations of the internal supply voltage generation unit 331 will now be described. Broadly stated, the internal supply voltage generation unit 331 is responsive to the external supply voltage VEXT and the reference voltage VREFP and generates an internal supply voltage VINT. When the reference voltage VREFP is applied to the gates of the NMOS transistors 731 and 733, the NMOS transistors 731 and 733 are turned on. This reduces the magnitude of the voltage at the node N5, which activates the driver 721 to thereby generate the internal supply voltage VINT. The internal supply voltage VINT is applied to the gate of the NMOS transistor 732. Accordingly, when the magnitude of the internal supply voltage VINT increases and exceeds the magnitude of the reference voltage VREFP, the current flowing through the NMOS transistor 732 is greater than the current flowing through the NMOS transistor 731. This turns the PMOS transistors 741 and 742 on and increases the magnitude of the voltage at the node N5. As a result, less current flows through the driver 721, which reduces the magnitude of the internal supply voltage VINT. When the magnitude of the internal supply voltage VINT is reduced, more current flows through the NMOS transistor 731 than the NMOS transistor 732, which increases the magnitude of the internal supply voltage VINT. As described above, the comparator 711 and the driver 721 maintain the internal supply voltage at a constant magnitude during steady state operation.

The principles of the present invention have been illustrated herein as they are applied to an integrated circuit that includes first and second logic circuits therein, e.g., a memory cell array and peripheral circuitry that is electrically coupled to the memory cell array. The integrated circuit includes a margin test voltage generator 301 that is powered at a first power supply voltage VEXT and generates a second power supply voltage VINT that has a magnitude that is less than the magnitude of the first power supply voltage VEXT. The second power supply voltage VINT can therefore be used to power one of the first and second logic circuits to perform a low supply voltage margin test thereon while using the first power supply voltage VEXT to power the other logic circuit, which is not under test. Advantageously, the magnitude of the internal supply voltage VINT can be reduced from a predetermined magnitude, which is typically used for normal operation, to a desired magnitude for performing a low supply voltage margin test without the need to reduce the external supply voltage VEXT to the same reduced magnitude. A potential difference can therefore be maintained between the external supply voltage VEXT and the internal supply voltage VINT during a low supply voltage margin test In concluding the detailed description, it should be noted that many variations and modifications can be made to the preferred embodiment without substantially departing from the principles of the present invention. All such variations and modifications are intended to be included herein within the scope of the present invention, as set forth in the following claims.

We claim:

1. An integrated circuit, comprising:
   a margin test voltage generator that is powered at a first power supply voltage and generates a second power supply voltage having a magnitude that is less than a magnitude of the first power supply voltage; and
   first and second non-test logic circuits that are powered at the first and second power supply voltages, respectively, during a low supply voltage margin test of the second logic circuit.

2. An integrated circuit as recited in claim 1, wherein the margin test voltage generator comprises:
   a reference voltage generation unit that is responsive to a control signal having a plurality of states and generates a first reference voltage having a magnitude that corresponds to the state of the control signal.

3. An integrated circuit as recited in claim 2, wherein the margin test voltage generator further comprises:
   a scaling unit that scales the magnitude of the first reference voltage to generate a second reference voltage.

4. An integrated circuit as recited in claim 3, wherein the scaling unit comprises:
   a controller that is responsive to the second reference voltage and generates a feedback voltage; and
   a differential amplifier having first and second input terminals that are coupled to the first reference voltage and the feedback voltage respectively and that generates the second reference voltage.

5. An integrated circuit as recited in claim 3, wherein the margin test voltage generator further comprises:
   a supply voltage generation unit that is responsive to the second reference voltage and generates the second power supply voltage, the second reference voltage and the second power supply voltage having approximately a same magnitude.

6. An integrated circuit as recited in claim 5, wherein the supply voltage generation unit comprises:
   a comparator having first and second input terminals that are coupled to the second reference voltage and the second power supply voltage respectively; and
   a driver that is responsive to the comparator to maintain the second reference voltage and the second power supply voltage at approximately a same magnitude.

7. An integrated circuit as recited in claim 1, wherein the second non-test logic circuit comprises:
   a memory cell array.

8. An integrated circuit as recited in claim 7, wherein the first non-test logic circuit comprises:
   peripheral circuitry electrically coupled to the memory cell array.

9. A method of performing a low supply voltage margin test, comprising the steps of:
   powering an integrated circuit comprising first and second non-test logic circuits at a first power supply voltage; and
   powering the first non-test logic circuit at the first power supply voltage and the second non-test logic circuit at a second power supply voltage during a low supply voltage margin test, the magnitude of the first power supply voltage being greater than the magnitude of the second power supply voltage.

10. A method as recited in claim 9, wherein the powering the first non-test logic circuit at the first power supply voltage and the second non-test logic circuit at the second power supply voltage step comprises the step of:
    generating, responsive to a control signal having a plurality of states, a first reference voltage having a magnitude that corresponds to the state of the control signal.

11. A method as recited in claim 10, wherein the powering the first non-test logic circuit at the first power supply voltage and the second non-test logic circuit at the second power supply voltage step further comprises the step of:
    scaling the magnitude of the first reference voltage to generate a second reference voltage.

12. A method as recited in claim 11, wherein the powering the first non-test logic circuit at the first power supply voltage and the second non-test logic circuit at the second power supply voltage step further comprises the step of:
    generating, responsive to the second reference voltage, the second power supply voltage, the second reference voltage and the second power supply voltage having approximately a same magnitude.

13. A method of performing a low supply voltage margin test, comprising the steps of:
    powering an integrated circuit comprising first and second non-test logic circuits at a first power supply voltage during non-test operation;
    generating, responsive to a control signal having a plurality of states and the first power supply voltage, a second power supply voltage having a magnitude that is less than the first power supply voltage; and
    powering the non-test second logic circuit at the second power supply voltage during a low supply voltage margin test while continuing to power the first non-test logic circuit at the first power supply voltage.

14. A method as recited in claim 13, wherein the step of generating the second power supply voltage comprises:
    generating, responsive to the control signal, a first reference voltage having a magnitude that corresponds to the state of the control signal.

15. A method as recited in claim 14, wherein the step of powering the second non-test logic circuit at the second power supply voltage during the low supply voltage margin test while continuing to power the first non-test logic circuit at the first power supply voltage comprises:
    generating a feedback voltage in response to a second reference voltage having a magnitude that is greater than the first reference voltage; and
    generating the second reference voltage using a differential amplifier, wherein the differential amplifier is responsive to the first reference voltage and the feedback voltage, respectively.

16. A method as recited in claim 15, further comprising the steps of:
    comparing the second reference voltage with the second power supply voltage;
    maintaining, in response to the comparison of the second reference voltage with the second power supply voltage, the second power supply voltage and the second reference voltage at approximately a same magnitude.

* * * * *